(12) United States Patent
Sullivan et al.

(10) Patent No.: US 7,526,395 B2
(45) Date of Patent: Apr. 28, 2009

(54) LOGIC ANALYZER USING A DIGITAL FILTER

(75) Inventors: Steven K. Sullivan, Beaverton, OR (US); Michael S. Hagen, Vancouver, WA (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/850,122

(22) Filed: Sep. 5, 2007

(65) Prior Publication Data

US 2009/0063072 A1    Mar. 5, 2009

(51) Int. Cl.
*G01R 29/02* (2006.01)
*G06F 19/00* (2006.01)

(52) U.S. Cl. ....................................................... 702/79
(58) Field of Classification Search .................... 702/79
See application file for complete search history.

(56) References Cited

U.S. PATENT DOCUMENTS

| | | | | |
|---|---|---|---|---|
| 4,338,677 A | * | 7/1982 | Morrill et al. ................ 713/600 |
| 4,481,647 A | * | 11/1984 | Gombert et al. ............. 375/356 |
| 4,788,492 A | * | 11/1988 | Schubert ...................... 714/724 |
| 5,446,650 A | | 8/1995 | Overhage |
| 5,526,286 A | * | 6/1996 | Sauerwein et al. ............ 702/79 |
| 5,854,996 A | | 12/1998 | Overhage |
| 7,352,167 B2 | * | 4/2008 | Sullivan et al. .......... 324/121 R |
| 2004/0223569 A1 | * | 11/2004 | Hagen et al. ................. 375/355 |
| 2004/0260493 A1 | * | 12/2004 | Richmond .................... 702/79 |
| 2008/0048726 A1 | * | 2/2008 | Hafed ........................... 327/9 |

* cited by examiner

*Primary Examiner*—Michael P. Nghiem
*Assistant Examiner*—Cindy H Khuu
(74) *Attorney, Agent, or Firm*—Francis I. Gray; Thomas F. Lenihan

(57) ABSTRACT

A logic analyzer having clock channels and data channels includes digitizer followed by a digital filter in each channel, the digital filter compensating for losses in signal fidelity in a signal under test. The resulting enhanced multi-bit samples are stored in respective waveform memories for subsequent display as analog waveforms and as logic data. The multi-bit samples from each channel are re-sampled by a regenerated sample clock to determine the logic values of the signal at precise times. For high speed serial data, each channel is divided into multiple clock channels and sampling channels, the outputs from the clock channels being phase adjusted to provide a precise sample clock to the sampling channels and the outputs from the sampling channels being combined to form a serial data output.

8 Claims, 17 Drawing Sheets

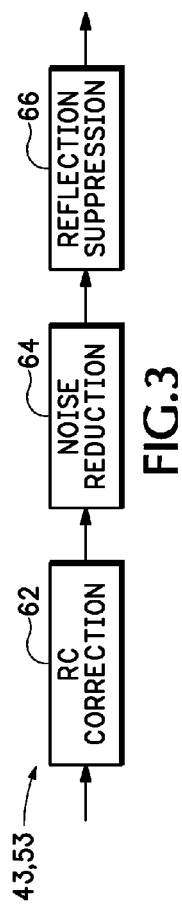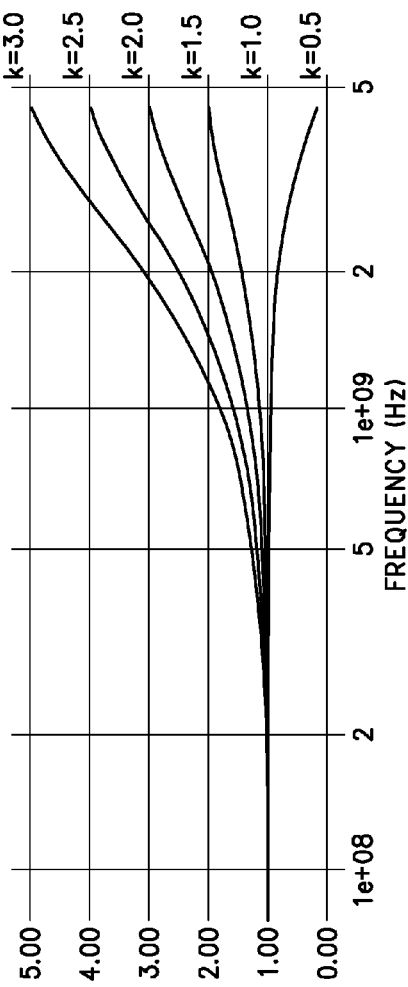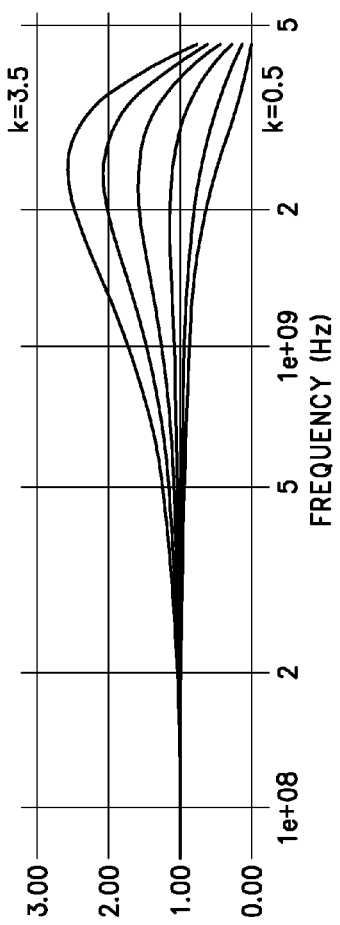

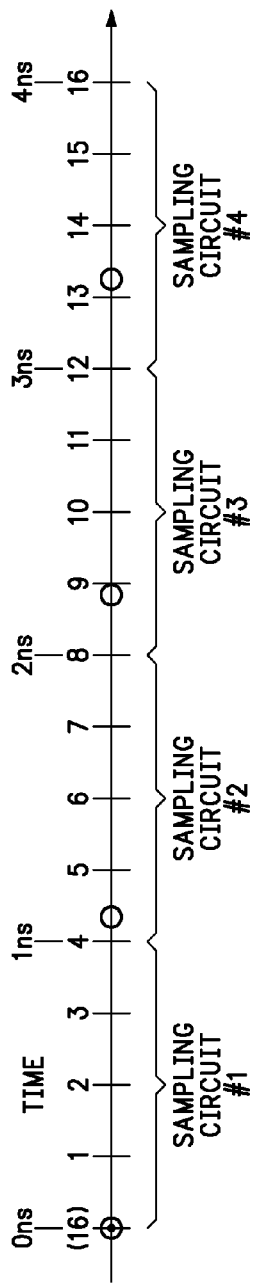

| SAMPLE PERIOD | A | B | C |
|---|---|---|---|
| 1.0ns | 0 | 1 | 0 |
| 1.1ns | 0.4 | 1.1 | 0.1 |
| 1.2ns | 0.8 | 1.2 | 0.2 |
| 1.3ns | 1.2 | 1.3 | 0.3 |
| 1.334ns | 0.002 | 1.334 | 0.334 |
| 1.4ns | 0.2 | 1.4 | 0.4 |
| 1.5ns | 0.5 | 1.5 | 0.5 |
| 1.6ns | 0.8 | 1.6 | 0.6 |
| 1.7ns | 1.1 | 1.7 | 0.7 |
| 1.8ns | 1.4 | 1.8 | 0.8 |
| 1.9ns | 1.7 | 1.9 | 0.9 |
| 2.0ns | 0 | 2 | 1 |
| 2.1ns | 0.2 | 2.1 | 1.1 |
| 2.2ns | 0.4 | 2.2 | 1.2 |
| 2.3ns | 0.6 | 2.3 | 1.3 |
| 2.4ns | 0.8 | 2.4 | 1.4 |
| 2.5ns | 1 | 2.5 | 1.5 |
| 3ns | 2 | 3 | 2 |
| 5ns | 1 | 5 | 4 |

FIG.18

| CYCLE | SAMPLING CIRCUIT DIGITAL CLOCK VALUE | | | | SAMPLE TIME | | | |
|---|---|---|---|---|---|---|---|---|
| | 1 | 2 | 3 | 4 | 1 | 2 | 3 | 4 |
| 0 | 0 | −1.0 | 0.3 | −0.7 | 0 | | 2.3ns | |
| 1 | 0.6 | −0.4 | 0.9 | −0.1 | 4.6ns | | 6.9ns | |
| 2 | −1.1 | 0.2 | −0.8 | 0.5 | | 9.9ns | | 11.5ns |
| 3 | −0.5 | 0.8 | −0.2 | −1.2 | | 13.8ns | | |
| 4 | 0.1 | −0.9 | 0.4 | −0.6 | 16.1ns | | 18.4ns | |
| 5 | 0.7 | −0.3 | −1.3 | 0.0 | 20.7ns | | | 23.0ns |

| CYCLE | SAMPLING CIRCUIT DIGITAL CLOCK VALUE | | | | SAMPLE TIME ERROR (FROM 1.1ns) | | | |
|---|---|---|---|---|---|---|---|---|
| | 1 | 2 | 3 | 4 | 1 | 2 | 3 | 4 |
| 0 | 0 | 0.096 | 0.193 | 0.289 | 0 | 4ps | 7ps | 11ps |
| 1 | 0.386 | 0.482 | 0.578 | 0.675 | 14ps | 18ps | 22ps | 25ps |
| 2 | 0.771 | 0.868 | 0.964 | 0 | 29ps | 32ps | 36ps | 0 |
| 3 | 0.096 | 0.192 | 0.289 | 0.385 | 4ps | 8ps | 11ps | 15ps |

FIG.23

| CYCLE | SAMPLING CIRCUIT DIGITAL CLOCK VALUE | | | | SAMPLE TIME ERROR (FROM 1.09ns) | | | |
|---|---|---|---|---|---|---|---|---|
| | 1 | 2 | 3 | 4 | 1 | 2 | 3 | 4 |
| 0 | 0 | 0.096 | 0.193 | 0.289 | 0 | -6ps | -13ps | -19ps |
| 1 | 0.350 | 0.447 | 0.543 | 0.640 | 10ps | 3ps | -3ps | -10ps |
| 2 | 0.701 | 0.797 | 0.893 | 0.990 | 19ps | 13ps | 7ps | 0 |
| 3 | -0.010 | 0.087 | 0.183 | 0.279 |  | -7ps | -13ps | -19ps |

FIG.24

| CYCLE | SAMPLING CIRCUIT DIGITAL CLOCK VALUE | | | | SAMPLE TIME ERROR (FROM 1.11ns) | | | |
|---|---|---|---|---|---|---|---|---|
| | 1 | 2 | 3 | 4 | 1 | 2 | 3 | 4 |
| 0 | 0 | 0.096 | 0.193 | 0.289 | 0 | 14ps | 27ps | 41ps |
| 1 | 0.420 | 0.517 | 0.613 | 0.710 | 20ps | 33ps | 47ps | 60ps |
| 2 | 0.841 | 0.937 | -0.027 | 0.069 | 39ps | 53ps |  | 31ps |
| 3 | 0.200 | 0.297 | 0.393 | 0.490 | 10ps | 23ps | 37ps | 50ps |

LOGIC ANALYZER USING A DIGITAL FILTER

FIELD OF THE INVENTION

The present invention generally relates to test and measurement instrument, and more particularly to a logic analyzer using a digital filter to improve fidelity of an input data signal for better timing accuracy while simultaneously providing for display of an analog representation of the input data signal.

BACKGROUND OF THE INVENTION

The basic idea of producing logic signal displays for a digital input signal by sampling the digital input signal as an analog signal to produce multi-bit digital samples which are then processed to determine logic states over time is outlined in U.S. Pat. Nos. 5,446,650 and 5,854,996, both entitled "Logic Signal Extraction". The "logic oscilloscope" to which these patents relate is the Tektronix TLS216, manufactured by Tektronix, Inc. of Beaverton, Oreg. In this instrument, sixteen (16) input channels are first rapidly sampled and the analog data is stored in a capacitor array of a FISO (Fast-In/Slow-Out) circuit. Later, the data in the capacitor array is digitized at a slower rate and stored in a memory having a record length of up to two thousand (2,000) samples. After the acquisition operation is completed, the records are then processed with software using one or more threshold values to produce logic waveforms for display.

One disadvantage of this scheme is that putting digitized data into memory is very inefficient compared to typical memory contents of a logic analyzer. A logic analyzer may store a single bit per channel per data clock cycle, whereas the TLS216 stores a byte per channel per sample clock cycle. There may be many sample clocks per data clock, making memory use many times less efficient because much more data has to be stored.

Another disadvantage of this scheme is that certain common types of logic analyzer triggers use the logic level of the input signals. To obtain common logic analyzer trigger modes, an instrument uses traditional logic analyzer signal comparators. However, it is not possible with this architecture to use the digitized data in the trigger circuitry because the digitized data is only available after a trigger has been detected and the acquisition process is completed.

The concept of real-time processing of acquired information is presented in U.S. Pat. No. 5,526,286 entitled "Oversampled Logic Analyzer". This scheme is currently being used in Tektronix logic analyzer products, such as the TLA5000 and TLA7000 series. The input signals are sampled at a rate that is very fast for the technology being analyzed, i.e., many times faster than the data clock. The data, which is in the form of one-bit samples, is then processed in parallel. The high sample rate results in good time resolution, but the data is inefficiently coded. The sample rate is much higher than the Nyquist frequency of the signals being analyzed. The coding efficiency is greatly improved by a re-sampling operation using the data clock. Channels designated as clock channels are used to find the times of edge transitions. These times are then used to re-sample the other channels. After the re-sampling operation, the logic state of the data channels is written into a deep memory along with a time stamp.

The '286 patent works with the deep memory, and is compatible with traditional logic analyzer triggering modes. It also provides much better timing resolution than that provided by the data clock. However, it does not allow for correction of the signal fidelity, and it does not support a way to view the analog waveform.

What is desired is a scheme for implementing a logic analyzer that allows for correction of the signal fidelity, allows a display of an analog waveform, and allows for the re-sampling of the data based on the data clock so that an efficient coding of the state of the data lines may be stored in a deep memory.

BRIEF SUMMARY OF THE INVENTION

A logic analyzer uses a digital filter to improve fidelity of an input data signal for better timing accuracy while simultaneously providing for display of an analog representation of the input data signal. The logic analyzer has at least a clock channel and a plurality of associated data channels and includes in each channel a signal digitizer preceding a digital filter that compensates for losses in signal fidelity in a signal being applied to the input of the channel. The resulting enhanced multi-bit samples of the input signals are stored in respective waveform memories for subsequent display as analog waveforms together with logic data derived from the channels. The multi-bit samples from each channel are re-sampled as they are received, with the clock channel detecting edges to generate a sample clock for the data channels and the data channel sampling the multi-bit samples in response to the sample clock to determine the logic values for the signal at precise times. For high speed serial data, each channel is divided into multiple clock channels and sampling channels, with the outputs from the clock channels being phase adjusted to provide a precise sample clock to the sampling channels and the outputs from the sampling channels being combined to form a serial data output.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 3 is a simplified block diagram view of a digital filter for the logic analyzer of FIG. 2 according to an embodiment of the present invention.

FIG. 4 is a graphic view of a frequency response for an RC correction filter of the digital filter of FIG. 3 according to an embodiment of the present invention.

FIG. 5 is a graphic view of a frequency response for the series combination of the RC correction filter and a noise reduction filter according to an embodiment of the present invention.

FIG. 16 is a timing diagram view illustrating the operation of the channel of FIG. 15 according to an embodiment of the present invention.

FIG. 17 is a first Table view illustrating the operation of the channel of FIG. 15 according to an embodiment of the present invention.

FIG. 18 is a second Table view illustrating the values of constants used for different sample rates according to an embodiment of the present invention.

FIG. 19 is a third Table view illustrating the operation of the sampling channel of FIG. 15 at a different sample rate according to an embodiment of the present invention.

FIG. 22 is a fifth Table view illustrating the operation of the clock channel of FIG. 15 according to an embodiment of the present invention.

FIG. 23 is a sixth Table view illustrating the operation of the sampling channel of FIG. 15 at a lower end of the range of a nominal sampling rate according to an embodiment of the present invention.

FIG. 24 is a seventh Table view illustrating the operation of the sampling channel of FIG. 15 at a higher end of the range of the nominal sampling rate according to an embodiment of the present invention.

DETAILED DESCRIPTION OF THE DRAWING

Figure 1:
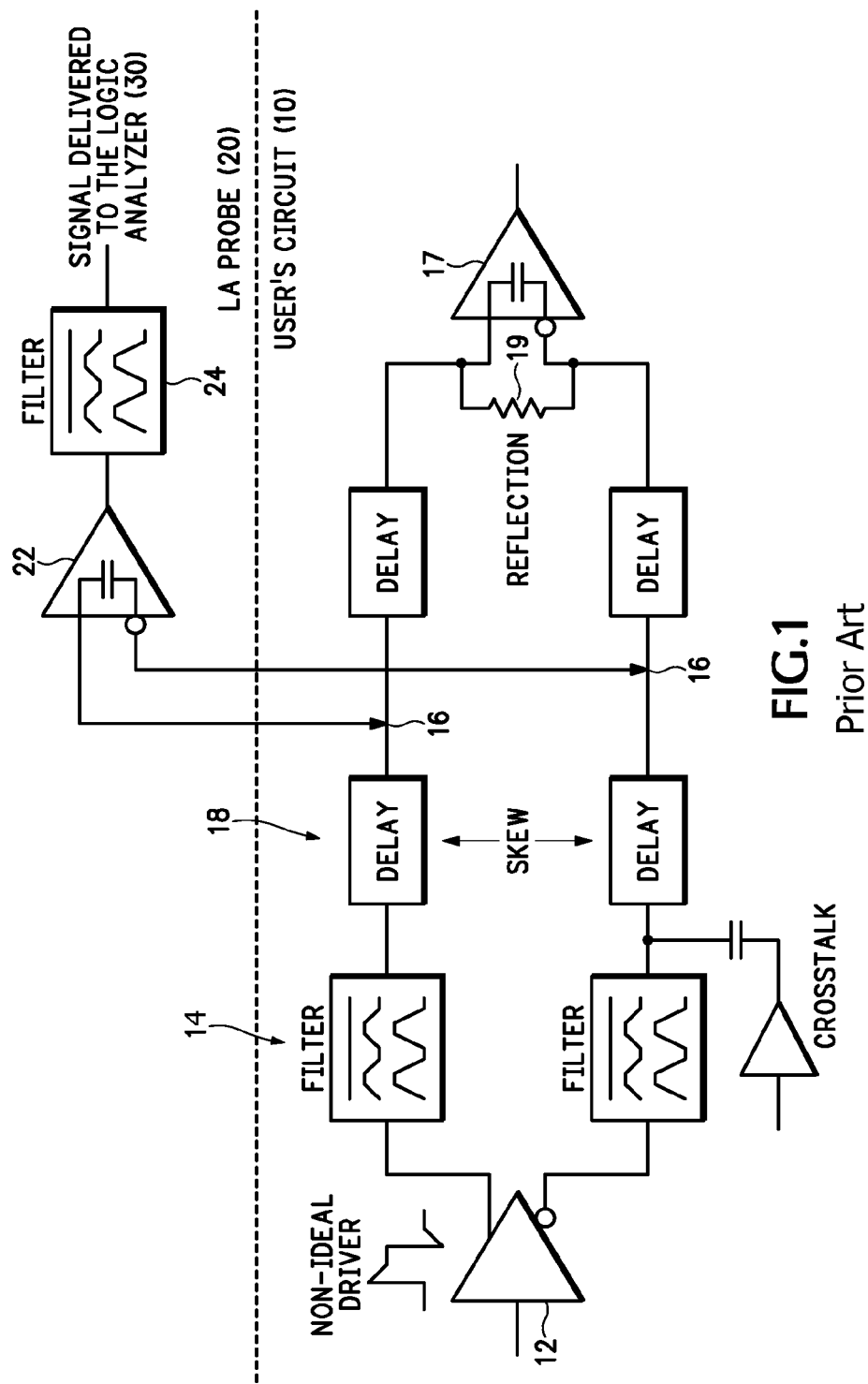
FIG. 1 is a block diagram view of a circuit under test being probed by a logic analyzer and known from the prior art, and is useful for understanding sources of signal distortion.

Referring to prior art FIG. 1, a circuit under test 10 is shown to illustrate how logic signals may become distorted. The logic signal is generated by a non-ideal driver 12. For high speed serial data transmission where the sample rate is greater than the data clock rate, the driver may include compensation, which may boost the high frequency components. The circuit board wiring acts as a filter 14, often attenuating the high frequency components of the signal. A logic analyzer probe 20 acts as a load, modifying the user's signal. When a differential probe 22 is used, the two sense points 16 may have a different delay 18 between the driver and the probe. This skew introduces another form of signal distortion that may completely remove certain frequency components of the signal. The signal conductors may not be terminated or, if there is a termination 19, the impedance may not be properly matched, causing a reflection. The user's receivers 17 introduce capacitive loads, causing greater reflections of the high frequency components. Crosstalk from adjacent signals further introduces noise into the signal. Finally, wiring and circuitry in the logic analyzer probe acts as another filter 24 which further distorts the signal before it is delivered to a comparator or an analog-to-digital converter (ADC) in the logic analyzer 30. All of these effects degrade the signal that reaches the logic analyzer 30. This is not a complete summary of factors that may reduce the signal quality or fidelity, but is intended to point out some of the more common, serious forms of distortion. One skilled in the art will recognize that in different situations, other effects may become significant.

Figure 2:
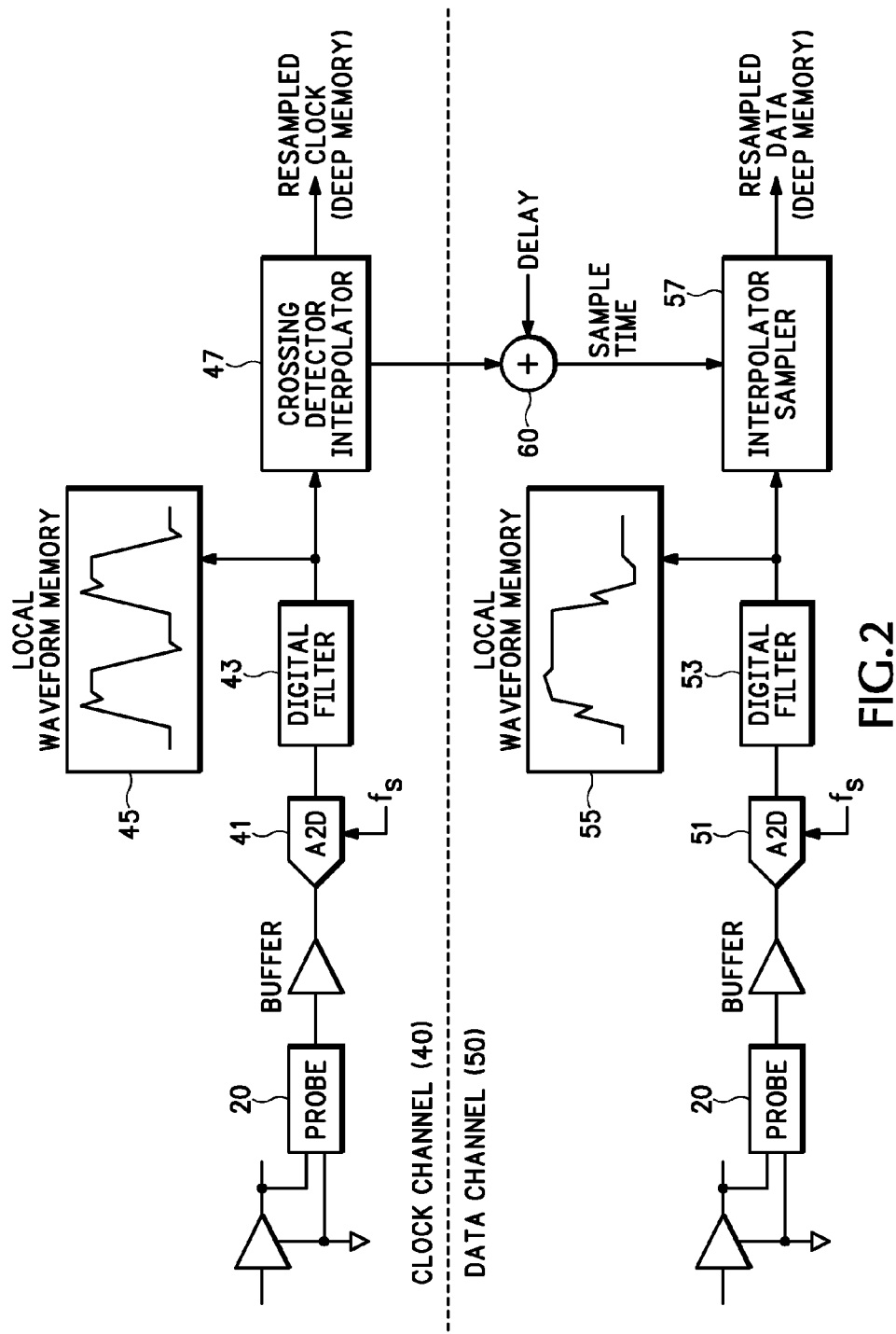
FIG. 2 is a simplified block diagram view of a logic analyzer according to an embodiment of the present invention.

FIG. 2 shows a logic analyzer in accordance with an embodiment of the subject invention, having two logic analyzer channels, one being a clock channel 40 and the other being a data channel 50. The clock channel 40 determines the times when edges of the input signal cross a threshold to determine a data clock for the signal, and the data channel 50 then samples the data signal at a fixed sample time relative to the data clock. The input signals from the probes 20 are delivered to respective ADCs 41, 51 (labeled phonetically as A2D). The resulting digitized signals are then applied to respective digital filters 43, 53 which may correct some forms of signal distortion, as described below.

The corrected signal is stored in respective memories 45, 55 for later analysis and for display of an analog version of the signal on a display device (not shown for simplicity). The corrected signal also is sent to respective interpolator circuits 47, 57 that perform crossing detection, data sampling and re-sampling as needed. In the clock channel 40, the time of each of the threshold crossings is detected in order to regenerate the data clock. This information is then sent as a sample clock to all of the data channels 50 (only one being shown here for simplicity) associated with the data clock, after an being adjusted by a clock-to-data delay (60). The data channels 50 use the sample clock to determine when to re-sample the data signal. The re-sampled clock and a logic level signal resulting from the re-sampled data from the respective interpolator circuits 47, 57 are then sent to a deep memory (not shown).

The ADCs 41, 51 operate at a high sample rate. There is a tradeoff between resolution and speed. The ADCs 41, 51 preferably operate at a sample rate that is at least four times the bandwidth of the probing system 20 in order to prevent aliasing of significant components of the signal. The high sample rate also makes interpolation, used to find the threshold crossing times in the crossing detector interpolator circuit 47, more accurate. More vertical accuracy and vertical resolution allow for better time resolution of the threshold crossings. To achieve the high sample rate the ADCs 41, 51 generally are realized as a number of ADCs working in parallel, and all are adjusted so that the gain and offsets are matched. The time between each sample is preferably close to uniform.

The digital filters 43, 53 provide compensation for signal loss in the probes 20. They may also compensate for some types of signal loss in the user's circuit 10. The digital filter 43, 53 may be a series of filters 62-66, as shown in FIG. 3. These filters 62-66 may be arranged in any order. An RC correction filter 62 corrects for a loss of amplitude of desirable high frequency signal components. A noise reduction filter 64 reduces the amplitude of very high frequencies, frequencies beyond desirable signal frequency components. A reflection suppression filter 66 may remove distortion caused by some types of signal reflections.

The RC correction filter 62 corrects for a reduction in the amplitude of high frequencies due to a single RC-type filter.

In real circuits the high frequency loss is more complicated than a single RC filter, so this is a compromise. The correction takes the difference between two consecutive samples and adds some portion of the difference to the digitized signal. If the digitized samples are S[n], S[n+1], S[n+2], . . . , the correction may be written as:

Corrected $S1[n+1]=S[n]+k*(S[n+1]-S[n])$

By varying the factor k, the RC correction filter 62 alters the frequency response as shown in the plot of FIG. 4. This plot is for data sampled at 10 GS/s. The gain at high frequencies, around 2.5 GHz, compensates for loss in the probing system 20 and, perhaps, for loss on the user's circuit board 10.

A disadvantage of the RC correction filter 62 is the very large gain at frequencies around Nyquist. Frequency components around Nyquist may be aliased and may be mostly noise, introduced by a low resolution ADC 41, 51. An effective way to reduce the gain at Nyquist is to use the noise filter 64, such as a two-term moving average filter, either before or after the RC correction filter 62. The formula for the moving average filter is:

Corrected $S2[n]=(S1[n]+S1[n-1])/2$

The plot of FIG. 5 shows the frequency response when the noise filter 64 or moving average filter is coupled in series with the RC correction filter 62.

Because the sample rate is very high, these digital filters 62-66 are preferably built using multiple pipes. The high sample rate is obtained by processing a number of samples in parallel. The number of pipes is determined by the speed of the logic and the sample rate. The speed of the logic and the amount of computing to be done in one pipe stage sets the system clock rate for the logic analyzer. The ratio between the system clock rate and the sample rate determines the number of parallel pipes. For the following examples it is assumed that four pipes are desired. This makes the principle clear even though the actual number of pipes may be larger. For instance if the sample rate is 10 GS/s and the system clock used to clock the digital filters is 500 MHz, then the circuitry becomes twenty pipes wide.

Figure 6:
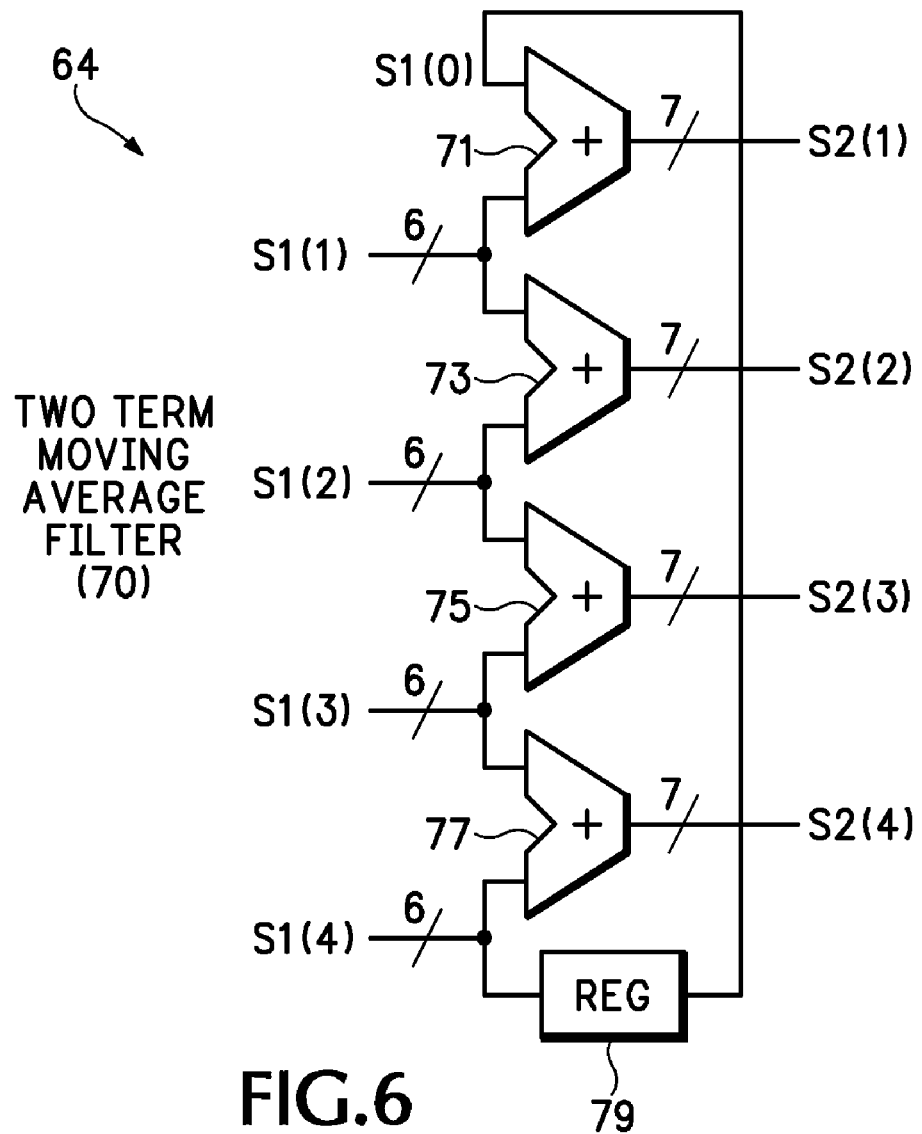
FIG. 6 is a simplified schematic view of the noise reduction filter according to an embodiment of the present invention.

Shown in FIG. 6 is a schematic diagram for the noise filter 64 as a two-term moving average filter 70 using four pipes 71-77. Six-bit samples arrive four samples at a time. The first sample is S1[1], followed by S1[2], etc. A register 79 delays S1[4] until the next clock cycle to produce S1[0]. The output has one bit of additional resolution which has a weight of ½. The input S1[n] comes from a pipeline register (not shown) and the output S2[n] goes to another pipeline register (also not shown). The moving average filter 70 may be coupled either at the front end or back end of the RC correction filter 62.

Figure 7:
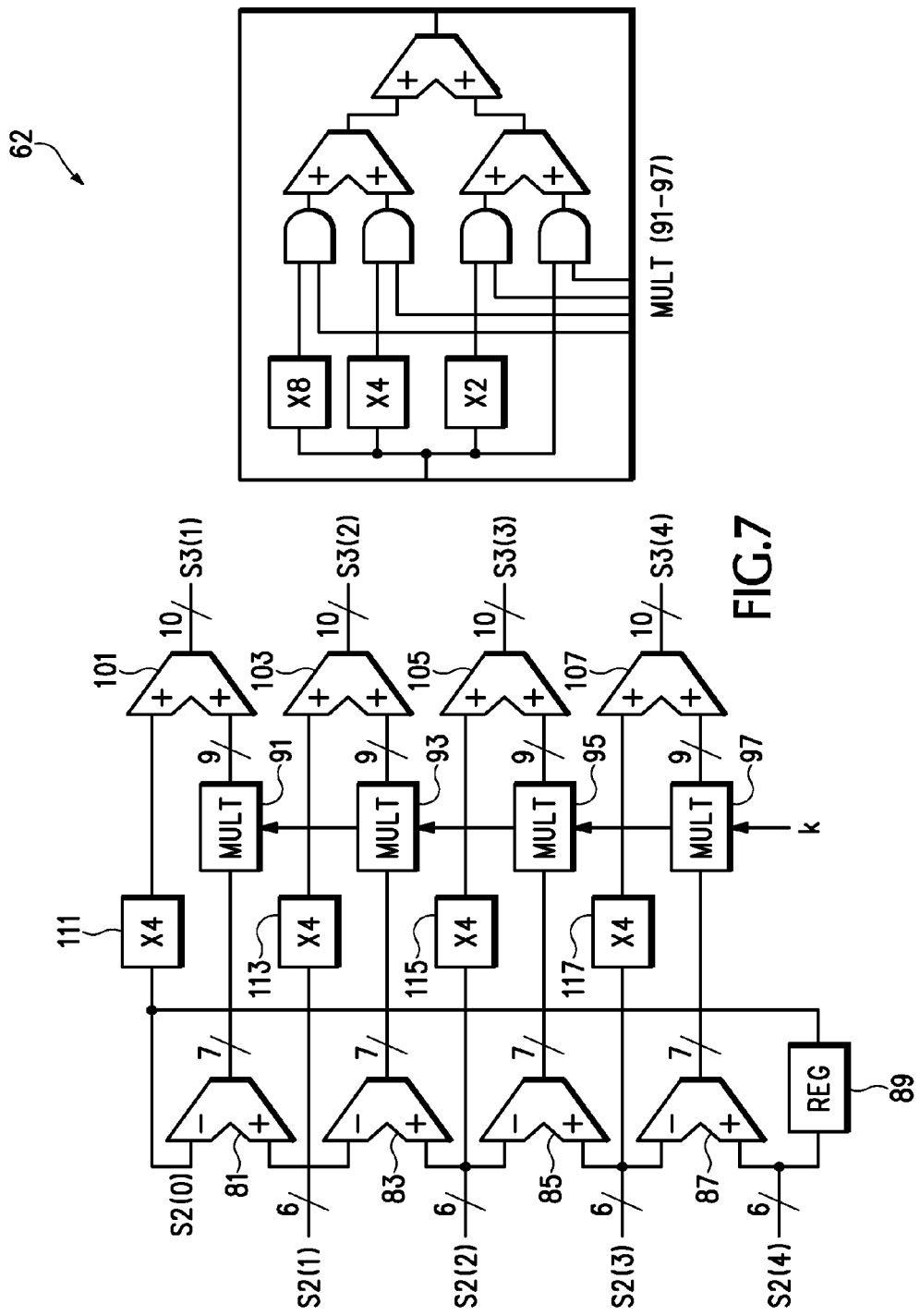
FIG. 7 is a simplified schematic view of the RC correction filter according to an embodiment of the present invention.

Referring now to FIG. 7, an implementation of the RC correction filter 62 is shown. The difference in inputs S2[n] is computed in four pipes 81-87, with a value S2[0] coming via a register 89 that delays S2[4] until the next system clock cycle. The differences are multiplied by the constant k in respective multipliers 91-97. The constant has values from 0 to 15, which are interpreted as the values of 0, 0.25, 0.5, . . . , 3, 3.25, 3.5 and 3.75. The outputs of the multipliers 91-97 are added (101-107) to the respective original inputs after multiplication by four (111-117). The output S3[n] of the RC correction filter 62 is four bits wider than the input. The two least significant bits provide additional resolution. The two most significant bits may be removed if a clipping circuit is added. The RC correction filter circuit 62 described here involves four stages of addition including the addition that occurs within the multipliers 91-97 as shown in the inset, so to operate this circuit at very high system clock rates pipeline registers may be added between each stage of addition.

Figure 8:
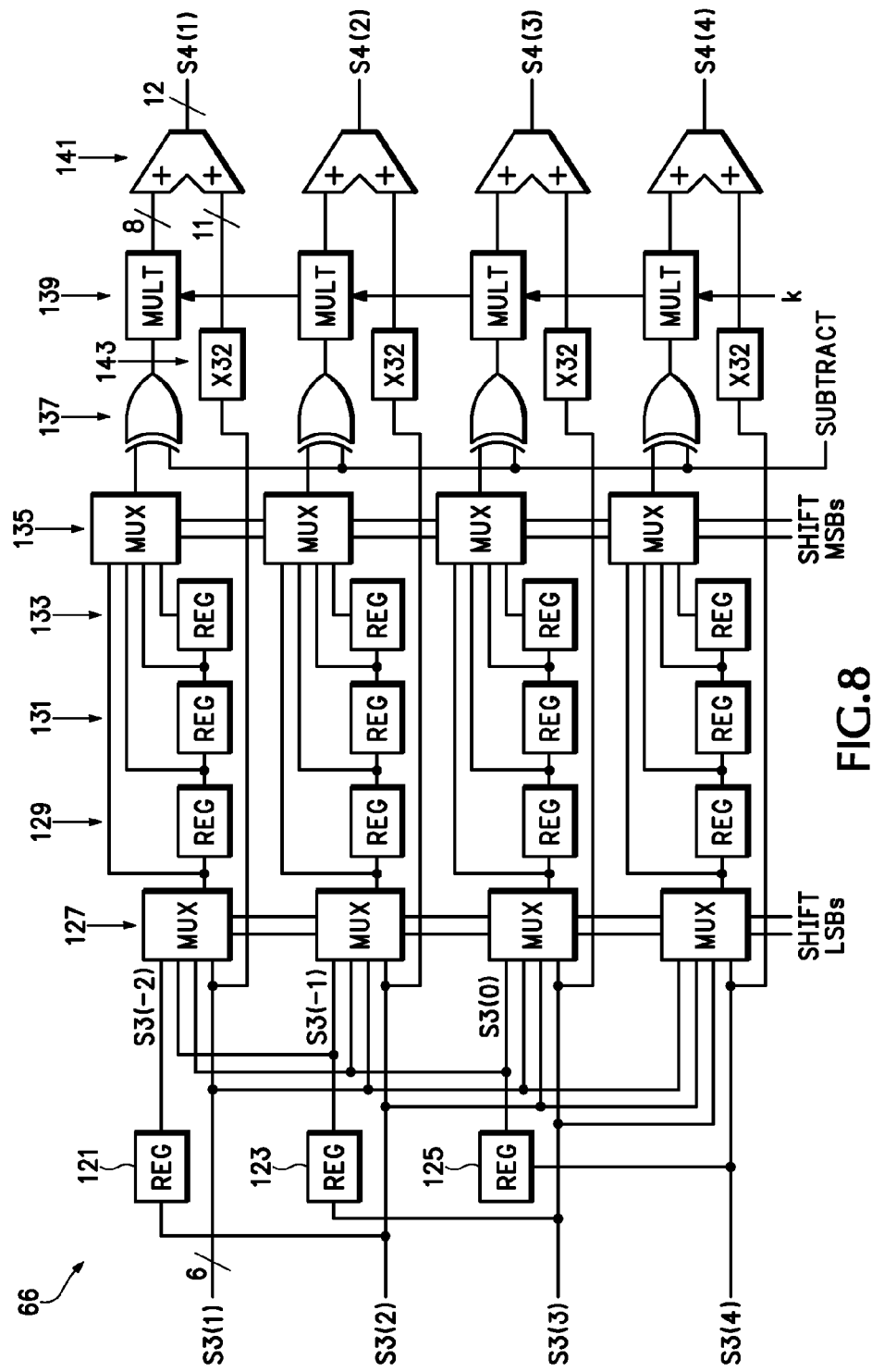
FIG. 8 is a simplified schematic view for a reflection suppression filter of the digital filter of FIG. 3 according to an embodiment of the present invention.

A schematic diagram for the reflection suppression filter 66 is shown in FIG. 8. Digitized samples arrive on S3[1] through S3[4]. Three registers 121-125 at the left delay the data one system clock, which is four sample times in this example. The outputs of these three registers 121-125 are S3[−2], S3[−1] and S3[0]. A delay of four samples results in a subscript that is four smaller. A first set of multiplexers 127 allow for a delay of 0, 1, 2 or 3 sample times. Following these multiplexers 127 are three sets of pipeline registers 129-133. Central multiplexers 135 select between data that has been delayed an additional 0, 4, 8 or 12 sample times. The data at the outputs of these multiplexers 135 are delayed 0 through 15 sample times. With a sample rate of 10 GS/s this delay may be up to 1.5 ns. If longer delays are desired, more pipeline stages may be added and larger multiplexers used.

Exclusive OR gates 137 change the sign of the delayed data, allowing both positive and negative reflections to be subtracted. Changing the sign of a two's complement number involves both a complement and an increment. The increment is omitted here in order to make the circuit simpler. This causes a slight change in the threshold level. The outputs of the exclusive OR gates 137 are sent to respective multipliers 139 to allow the level of the reflection to be set. The outputs from the multipliers 139 are the inverse of the reflection.

Finally, the inverse of the reflection is added (141) to the original signal. The circuit shown has the original signal being increased (143) by a factor of 32. If the same type of multiplier as shown previously in FIG. 7 is used, the multipliers 139 may increase the reflection component by a factor of 15. This accommodates reflections that are up to almost 50%.

For a 6-bit input the reflection filter circuit 66 produces a 12-bit output. The most significant bit is an extension of the range. The next six bits correspond to the input. The five least significant bits are additional resolution, some or all of which may be rounded or ignored.

Figure 9:
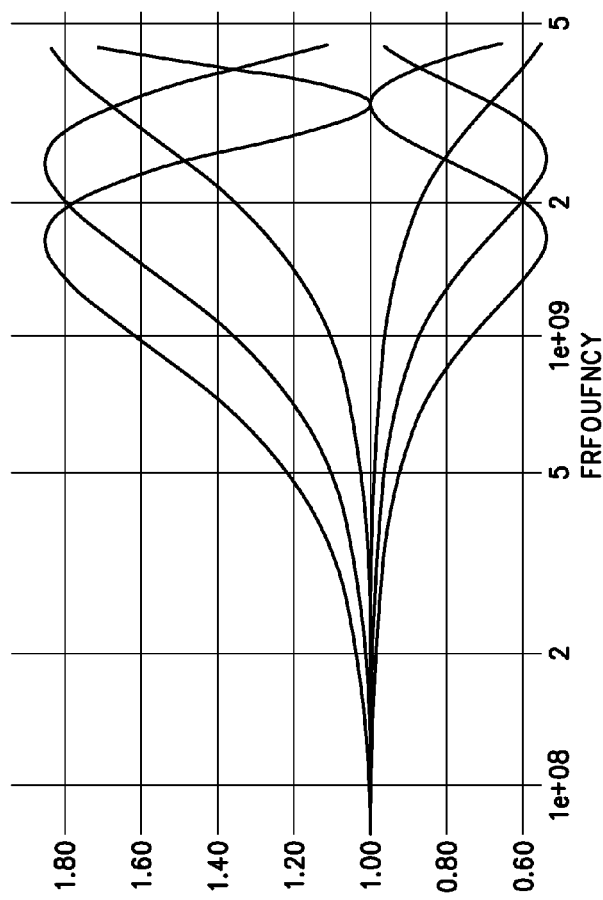
FIG. 9 is a graphic view of a frequency response for the reflection suppression filter according to an embodiment of the present invention.

The reflection suppression filter 66 as shown has some special cases. When the minimum delay is selected, the circuit changes the amplitude of the signal. When a small delay is selected, the circuit becomes a filter. The reflection suppression filters 66 represented by the plots in FIG. 9 are for a 30% reflection, both positive and negative, after a delay of 1, 2 or 3 samples. When the reflection suppression filter 66 is not being used to remove a reflection, it may be used to make additional adjustments to the high frequency gain of the signal. This may allow even better correction of high frequency signal loss.

Figure 10:
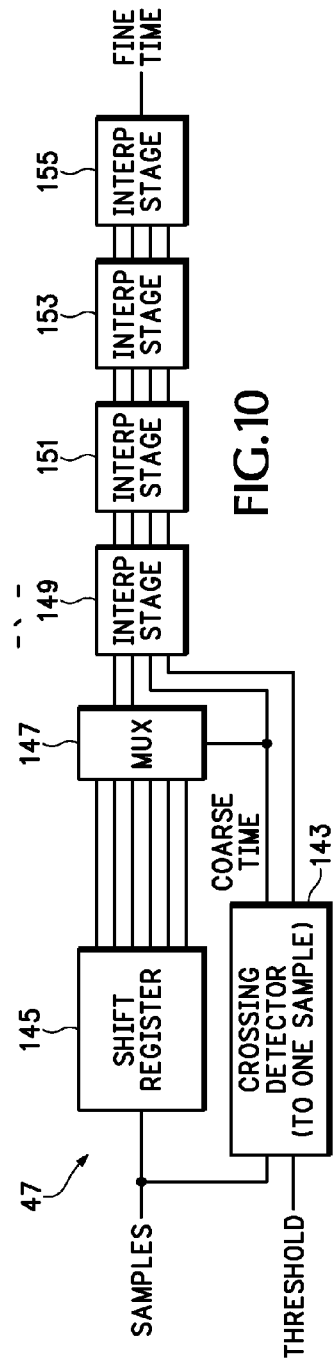
FIG. 10 is a block diagram view of a crossing detector/interpolator for the logic analyzer of FIG. 2 according to an embodiment of the present invention.

In the clock channel 40, the crossing detector interpolator 47 finds threshold crossing times. In the data channel 50, the same circuit may be used as the interpolator sampler 57, used to sample the state of the signal at a given sample time. The crossing detector 47 is shown in FIG. 10. Digitized samples arrive from the ADC 41, preferably after passing through the digital filter 43. Typically, a number of samples arrive on different pipes during the same system clock cycle. A crossing detector circuit 143 examines the samples and produces a "coarse time" when a threshold crossing is detected. The coarse time is used when there are multiple pipes of data, and it identifies where between pipes the threshold crossing is found. The samples also are placed in a shift register 145. When a threshold crossing is detected, the samples before and after the threshold crossing are in the shift register 145. The coarse time controls a multiplexer 147 that selects the samples on either side of the threshold crossing. These samples are passed to the first of many interpolation stages 149-155.

Each interpolation stage 149-155 receives at least two samples. These samples are interpolated to find the value of a sample halfway between the two. The interpolated sample is then compared to the threshold level to determine if the threshold crossing is located before or after the interpolated sample. The result of the comparison is then used to select the two new samples that are on either side of the threshold, one of these samples is the interpolated sample. These two samples are passed on to the next stage.

The coarse time also is passed into the first interpolation stage 149. This stage adds one additional bit of time resolution to the coarse time. The new time value is then passed on to the next interpolation stage 151 where another bit of resolution is added to the time. Leaving the last interpolation stage 155 is a time output with good resolution.

Figure 11:
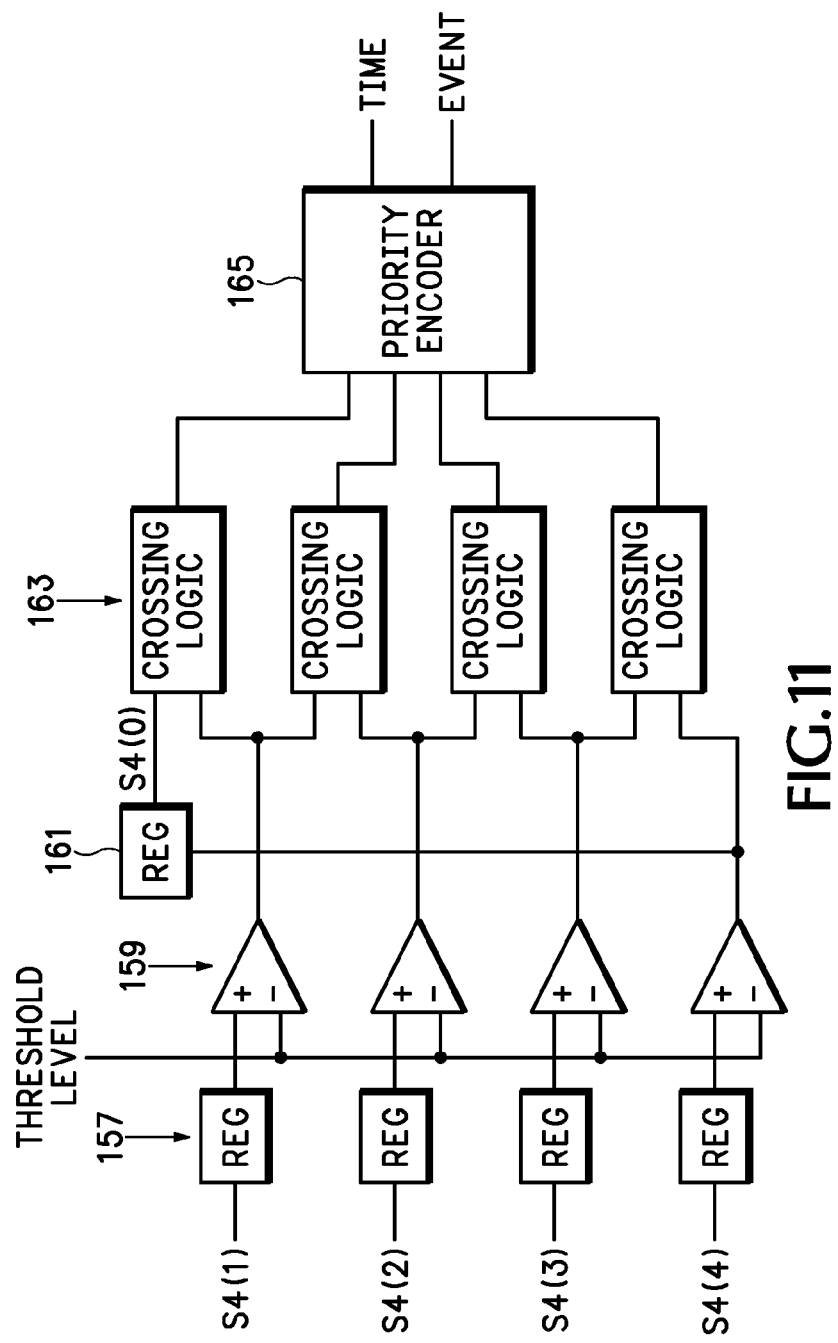
FIG. 11 is a block diagram view of a crossing detector for the crossing detector/interpolator of FIG. 10 according to an embodiment of the present invention.

The first step in finding a high resolution value of the crossing time is to find the samples on either side of the threshold. This may be done using the circuit shown in FIG. 11. Sampled data, that preferably has been digitally filtered, arrive at inputs S4, are captured in registers 157 and are compared against the threshold level by comparators 159. The output of the S4[4] comparison is delayed one system clock cycle by delay register 161 to become the output of an S4[0] comparison. Crossing logic 163 then determines if a crossing occurs between one sample and the next. The crossing logic 163 may be programmed to detect a rising edge, a falling edge or both rising and falling edges. The detected crossings are sent to a priority encoder 165 that produces an "event" signal when a crossing is detected and a "time" signal that identifies where the crossing is found. The priority encoder 165 also selects just one crossing in the case in which more than one crossing is detected during a system clock cycle. A single threshold level is shown in this illustration, but circuits for dual threshold levels may also be used, such as found in co-pending U.S. patent application Ser. No. 11/388, 925 now U.S. Pat. No. 7,352,167 entitled "Improved Digital Trigger."

Figure 12:
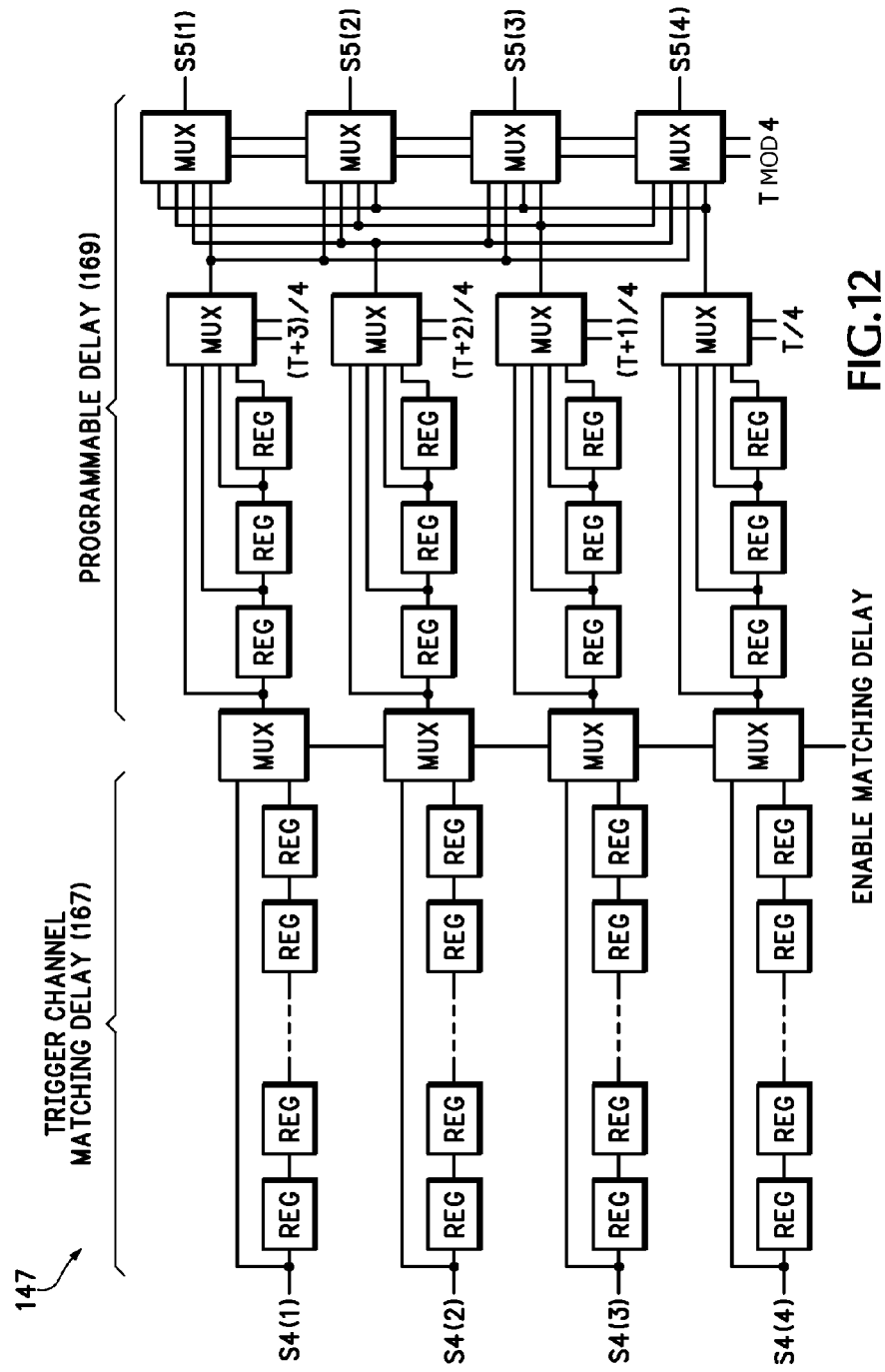
FIG. 12 is a simplified schematic view of a crossing detector multiplexer for the crossing detector/interpolator of FIG. 10 according to an embodiment of the present invention.

When the threshold crossing is determined, the "time" signal from the priority encoder 165 is sent to the multiplexer circuit 147 to select the samples that bridge the crossing and send them to the first of the series of interpolation stages 149-155. Such a multiplexer circuit 147 is shown in FIG. 12. The left side of the multiplexer 147 contains a first delay series of registers 167 that is not used in the crossing detector 47, but is used when sampling data in the data channel 50 by the sample interpolator 57. The right side 169 of the multiplexer circuit 147 takes a time value T and uses it to find four consecutive samples. If only two samples are desired, the right side stage 169 may be simplified. However, four samples may be used by the first interpolation stage 149 in order to improve the quality of the interpolation. The two samples on either side of the threshold crossing are labeled S5[2] and S5[3]. These two samples, and perhaps S5[1] and S5[4], are sent to the first interpolation stage 149.

Figure 13:
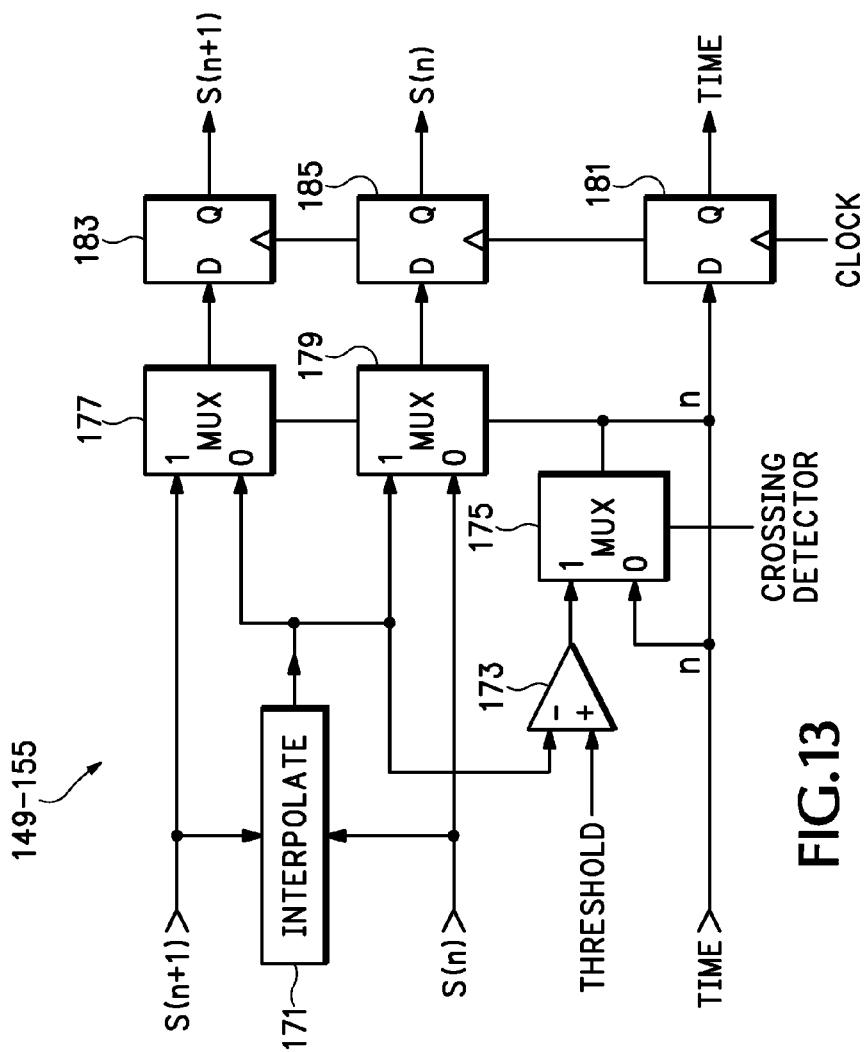
FIG. 13 is a block diagram view of an interpolator for the crossing detector/interpolator of FIG. 10 according to an embodiment of the present invention.

FIG. 13 shows a simplified version of a representative one of the interpolation stages 149-155. The interpolation stage 149-155 accepts two samples that straddle the threshold. The circuit then interpolates (171) between the two samples to find an estimate of the voltage at the center of the time interval. This interpolated value is compared with the threshold in a comparator 173 to estimate if the crossing happened in the first or second half of the interval. When this circuit is used as a crossing detector 47, the crossing detector signal is high, causing the output of the comparator 173 to be used via a first multiplexer 175. The comparator output becomes bit "n" of the crossing time. This time is passed on to the next interpolation stage via time register 181. The comparator output also causes the interpolated value to replace either S[n] or S[n+1] via multiplexers 177, 179 in output registers 183, 185 so that the next interpolation stage receives two samples that straddle the threshold, but have twice the effective sample rate as the samples that entered the stage.

When the interpolation stage shown in FIG. 13 is used in the interpolator sampler 57, the crossing detector signal is low which cuts the comparator 173 out of the circuit and passes, via the first multiplexer 175, bit "n" from the sample time to the control inputs of the selection multiplexer 177, 179. Application of the "n" bit results in the selection of either the first input and the interpolated value, or the second input and the interpolated value, for application to the next stage, starting with the most significant bit as the "n" bit for the first interpolation stage 149 and the least significant bit as the "n" bit for the last interpolation stage 155. This output from the last interpolation stage 155 is then compared to the threshold level in a last stage 188 (FIG. 14) to determine if the re-sampled data is a logic high or logic low. The re-sampled data is stored in the deep memory.

The simplest interpolator 171 is one that averages the values at its two inputs. This linear interpolator always produces the result $(S[n]+S[n+1])/2$. The accuracy of the crossing detector may be improved by increasing the quality of the interpolator 171. The greatest improvement occurs when the first interpolation stage 149 is improved. After the first interpolation stage 149, the effective sample rate has doubled and linear interpolation starts to be fairly accurate. The first interpolation stage 149 may be improved by using the following four-point interpolation formula:

$$\text{result}=(9*(S[n]+S[n+1])-(S[n-1]+S[n+2]))/16$$

This formula requires four samples to be input to the first interpolation stage 149. The values of 9 and 16 are selected because they provide a good interpolation, and also because they are easy to implement with addition and shifting. It is possible that the system clock rate may be chosen that is so high that the four-point interpolation may not be performed within one clock cycle. In this case, pipeline stages may be added to the first interpolation stage 149.

Figure 14:
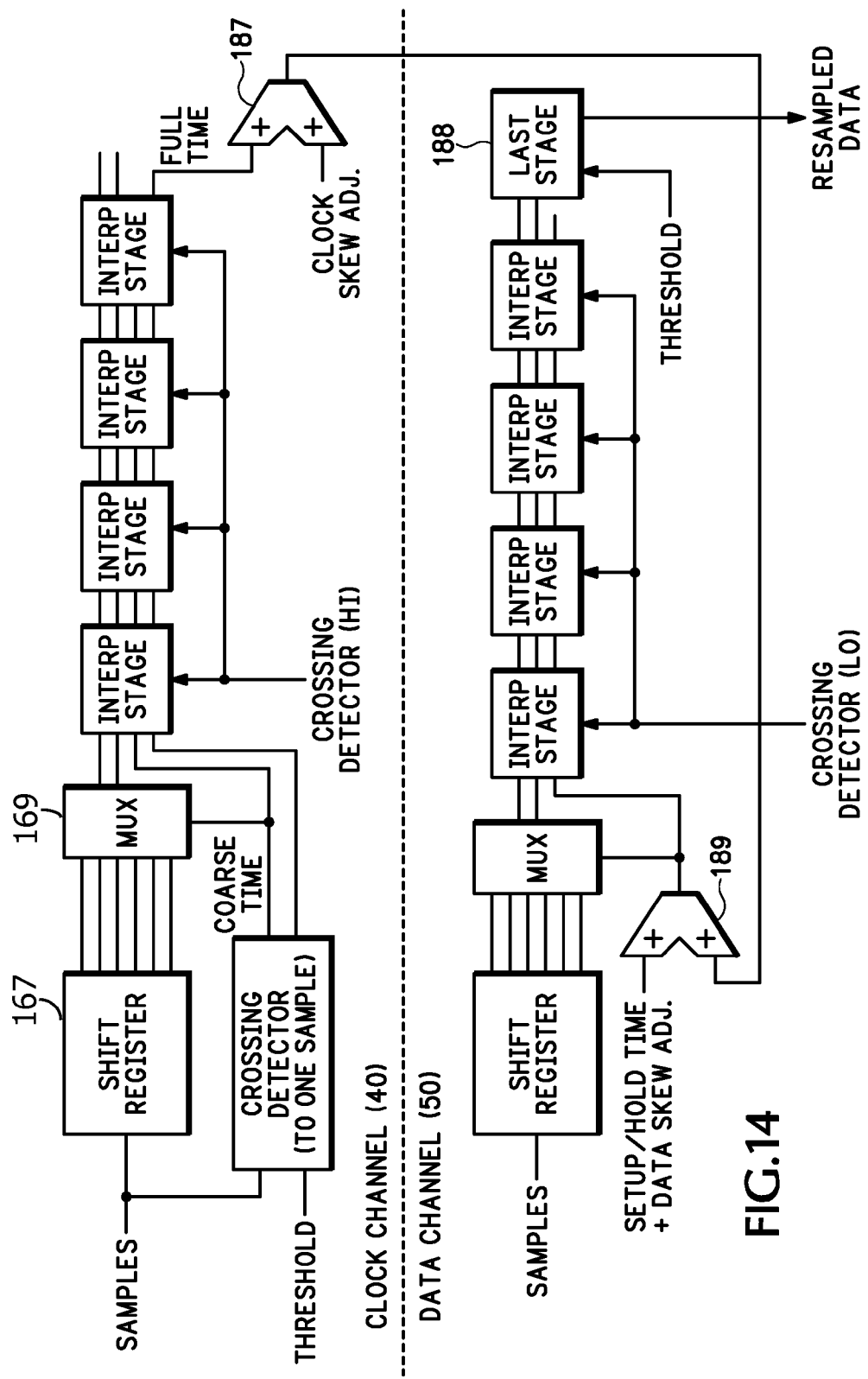
FIG. 14 is a block diagram view of the clock and data crossing detector and sampling interpolators for the logic analyzer of FIG. 2 according to an embodiment of the present invention.

The same, or similar, logic is used in both the clock and data channels 40, 50, as shown in FIG. 14. In the clock channel 40 the threshold crossing times are found. The crossing times are adjusted to compensate for skew in the clock channel via a summer 187. The adjusted clock times are then distributed to all of the associated data channels 50, only one being shown for ease in understanding. Each data channel 50 may further adjust the adjusted clock times via summer 189 to compensate for skew in the data channel and to add in a setup or hold time. The resulting adjusted clock times are used as the sample clock to select a portion of the data samples and to interpolate those samples to find the state of the data input at each time. The results after re-sampling are stored in the deep memory. The clock and data channels 40, 50 may be identical, although not shown as such here for simplicity.

It takes many system clock cycles to find the threshold crossings from the clock channels 40. Therefore, it is necessary to delay the data passing through the data channels 50 by an equal amount of time plus or minus an additional delay so that the data channel is sampled at the desired place relative to the threshold crossings from the clock channel 40. Also, some additional delay may be needed to allow for deskewing, as indicated above.

The same delay circuit 147, 169 shown in FIG. 12 is used in each of clock channels 40 and data channels 50, as shown in FIG. 14. These delay circuits provide a delay necessary to match the data channels 50 to the clock channels 40. Referring once again to FIG. 12, the left side stage 167 provides an initial delay. Then, an additional delay of "T" samples is produced by the programmable delay block 169. The sampled data from the digital filters 43, 53 enters the circuit at the left side, and delayed data exits from the right side and passes from this circuit to a sampling circuit 57 of FIG. 2. The value "T" selects the additional delay used to sample the data with a desired setup and hold time. The value "T" is used to select the samples that are passed on to the sampling circuit 57. In this example, the value of "T" is expressed in four bits. Because there are four pipes in this example, the least significant two bits (T MOD 4) are used to select the pipe and the most significant two bits are used to select the pipeline stage. Additional circuitry (not shown) is needed to produce the multiplexer select inputs of (T+1)/4, (T+2)/4 and (T+3)/4. The additional circuitry involves adding a fixed amount to T and then using the upper two bits to control the multiplexer select lines. In this example four consecutive samples are passed on to the sampling circuit 57. Four samples are needed when the first interpolation stage 149 of the sampling circuit 57 uses four-point interpolation. If linear interpolation is used, only two samples are sent on to the sampling circuit 57, as described previously.

Figure 15:
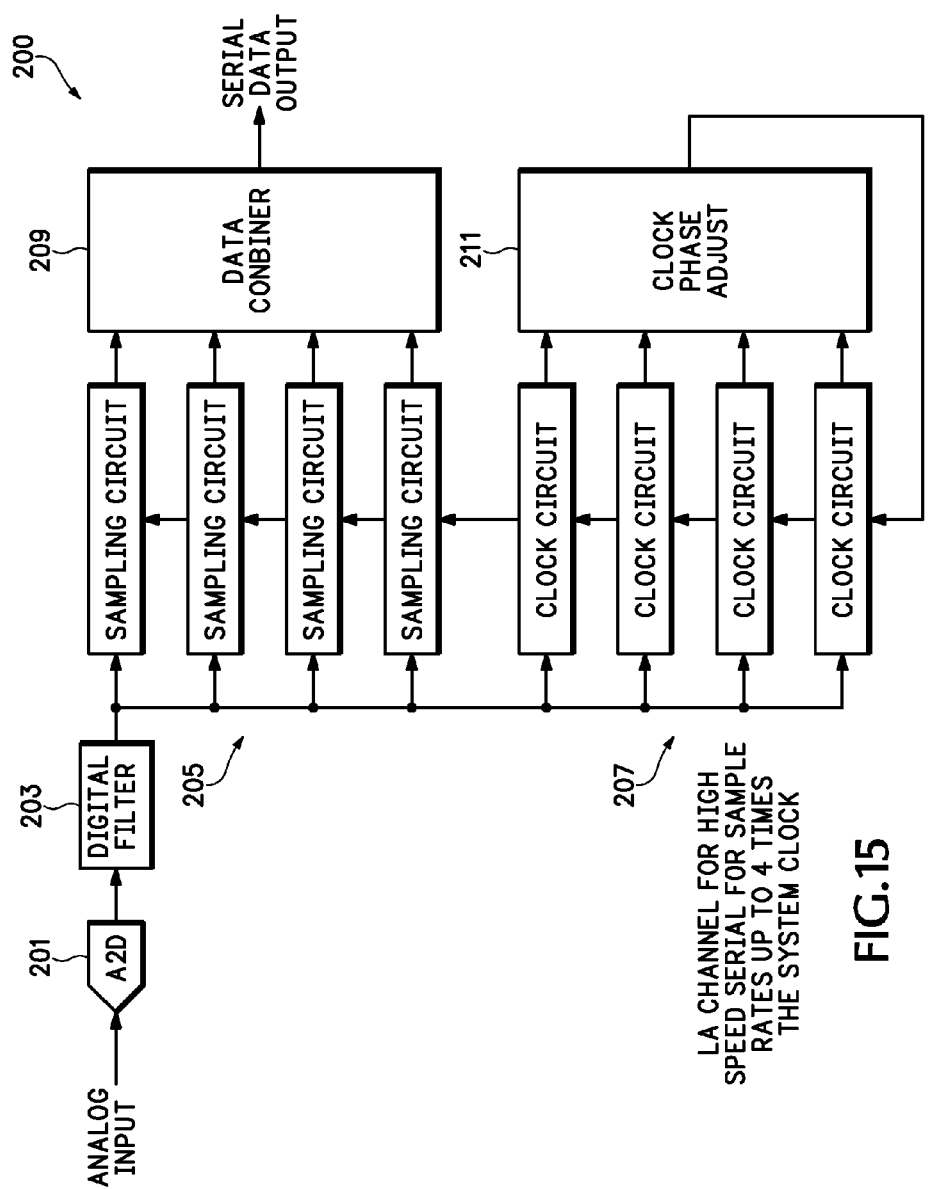
FIG. 15 is a block diagram view of a high speed serial data channel for the logic analyzer of FIG. 2 according to an embodiment of the present invention.

The serial data channel is considered to be high speed when the bit rate is greater than the system clock. Multiple channels are needed to sample the data and to recover the clock by finding the threshold crossing times. A circuit 200 capable of acquiring high speed serial data with a bit rate approximately four times the system clock rate is shown in FIG. 15. This circuit 200 uses eight logic analyzer (LA) channels. More or fewer channels may be used to accommodate higher or lower maximum bit rates. As previously mentioned, the analog serial data signal is digitized by an ADC 201 (labeled phonetically as "A2D") and preferably processed by a digital filter 203 for highest signal fidelity. The digitized and filtered data are input to eight channels for the purpose of this example, four of which are sampling channels 205 and four of which are clock channels 207. Both the sampling and clock channels 205, 207 may contain the same circuitry, but are programmed to operate in different modes. However there is no requirement that the sampling and clock channels 205, 207 be identical.

The four sampling channels 205 sample the digitized signal and pass up to four valid logic samples or bits to a data combiner circuit 209 during each system clock period. The data being passed to the data combiner 209 are at a rate exactly four times the system clock. The data combiner 209 discards invalid data.

The four clock channels 207 examine the digitized data to find every threshold crossing time. These times are compared to the predicted threshold crossing times determined by digital clocks. Each clock channel 207 passes a signal to a clock phase adjust circuit 211 that indicates how the digital clock phase is to be adjusted. The clock phase adjust circuit 211 then sends a signal back to the eight channels 205, 207 causing phase adjustments to take place. Each channel 205, 207 has a digital clock circuit. In the sampling channels 205, the digital clock controls when samples are acquired. In the clock channels 207, the digital clock predicts the time of threshold crossings.

The logic signal applied to the input is an analog signal. This signal is sampled or digitized at a rate that is higher than the system clock. For the purpose of this discussion, the system clock refers to the clock rate of the circuits being described, i.e., a system clock of 250 MHz has a clock period of 4 ns. For a sample rate of four GSa/s, there are sixteen sampled values being processed during each 4 ns system clock period. The sixteen values are referred to as sixteen pipes. Each pipe has a digital pipeline that passes one value through the circuitry.

The high speed circuit 200 shown in FIG. 15 shows four sampling channels 205. When there many data pipes, the data pipes are divided into N groups. These groups are connected to the N sampling channels 205 so that each group is processed by a different sampling channel. Alternatively, if the sampling channels 205 are general purpose logic analyzer channels, then all of the pipes are delivered to each channel and in this mode of operation each channel is programmed to process the data from just one group. In the following description there are four sampling channels 205 and sixteen pipelines of data so that each sampling channel processes the data on four pipelines.

The processing done by the sampling channels 205 is to sample the data at a specific time. This specific time may be a time that falls between the sample points, in which case interpolation is used. To perform interpolation, each sampling channel has at least one additional sample than just those in the group. This extra pipe, and additional pipes if four or six point interpolation is used, is also connected to each of the sampling channels 205. Each sampling channel has a digital clock circuit that determines the time at which samples are desired. Each digital clock circuit is programmed so that it only determines the sample times for its own group. In addition to computing the sample time, the digital clock also compares, on a cycle-by-cycle basis, if a sample should be taken.

The timing diagram of FIG. 16 is a timeline for one system clock period. The sixteen pipes of data are shown intersecting the timeline at the relative positions of their arrival. The oldest data at the left is a delayed version of pipeline 16 and is shown as "(16)". Pipes (16), 1, 2, 3 and 4 are delivered to the first sampling circuit $205_1$. For this example, linear interpolation is used. If a four-point interpolation is desired, the pipes (15) and 5 are also delivered to the first sampling circuit $205_1$. Also, sample times corresponding to a sample period of 1.1 ns are shown as circles on the timeline. To sample every 1.1 ns, the first sampling circuit $205_1$ samples the (16) pipe; the second sampling circuit $205_2$ samples the data between pipes 4 and 5; the third sampling circuit $205_3$ samples the data between pipes 8 and 9; and the last sampling circuit $205_4$ samples the data between pipes 13 and 14. Sampling between pipes is performed through a pipelined interpolation as described above.

It is the digital clock circuit of each sampling channel 205 that computes the sampling times, which are binary numbers. A value is computed for each system clock cycle. If a value is negative, it indicates that there is no sample to be taken within the group of pipes connected to that sampling channel 205. When the value is positive, the value indicates where within the group the sample is to be taken. The sample time is composed of an integer part and a fractional part. The integer part may be only zero or negative. When the integer part is positive, the fractional part is the sample time. A fractional value of zero indicates that the sample is taken at the earliest time, as shown on the timeline. A fractional value approaching one indicates that the sample is to be taken at the latest time, as shown on the timeline. Where each sampling channel 205 processes a group of four pipes, the most significant two bits of the fractional part control a multiplexer that selects the pipes between which interpolation is to occur. Referring to the timeline of FIG. 16, when the first sampling circuit 205, has a fractional value in the range of 0 to 0.2499, interpolation is performed between pipes (16) and 1; a value in the range of 0.25 to 0.4999 indicates interpolation between pipes 1 and 2; etc. The lesser significant bits direct the interpolation operation.

The digital clock value is given an initial value, which is updated on each system clock cycle. The basic algorithm for updating the digital clock amount is to add a value A and, if the resulting clock value is greater than or equal to 1.0, then subtract a different value B. The Table of FIG. 17 shows the digital clock values for a sample period of 1.1 ns when four sampling channels 205 are operated with a system clock period of 4 ns. In this case A=0.4 and B=1.1. The values under the heading "Sampling Circuit Digital Clock Value" are the values in the digital clock circuits of the four sampling channels 205. The right side of the Table contains the resulting sample times. Initially the four digital clock values are set to 0, 0.1, 0.2 and 0.3. With four sampling channels 205 and a 4 ns system clock period the sampling channels each span 1 ns period of time. The initial sampling time for the second sampling circuit 205₂ is 1.1 ns because the data delivered to it spans the time of 1 ns to 2 ns and the sampling circuit interpolates 10% of the way through this region of time. The digital clock values generally advance by 0.4 on each cycle, but after a few cycles of operation the clock value becomes one or greater. When this occurs the value is reduced by 1.1 so that the value never becomes one or greater. Therefore the third sampling circuit 205₃ has a value of −0.1 in clock cycle 2. This negative value is outside the interpolation range of the third sampling circuit and it does not acquire a valid sample. This is shown as a blank in the "Sample Time" portion of the Table. When the digital clock value is negative, the sampling circuit informs the data combiner 209, which drops this sample from the output. Since the desired sample rate is always less than the maximum sample rate, there are always sampling circuits that do not produce valid output on certain cycles.

To find the constants A and B, S is defined as the sample period, P is the system clock period, and N is the number of sampling channels 205.

$$A = N * (Int(P/S+1) * S/P - 1)$$

$$B = N * S/P$$

The initial value for each digital clock is found by setting the digital clock for the first sampling circuit 205₁ to an initial value of zero. The initial value for the next sampling circuit is found by adding a constant C to the value of the previous sampling circuit digital clock. If this results in a value that is one or greater, then also subtract B from the digital clock value:

$$C = N * S/P - 1$$

Figures 20, 21:
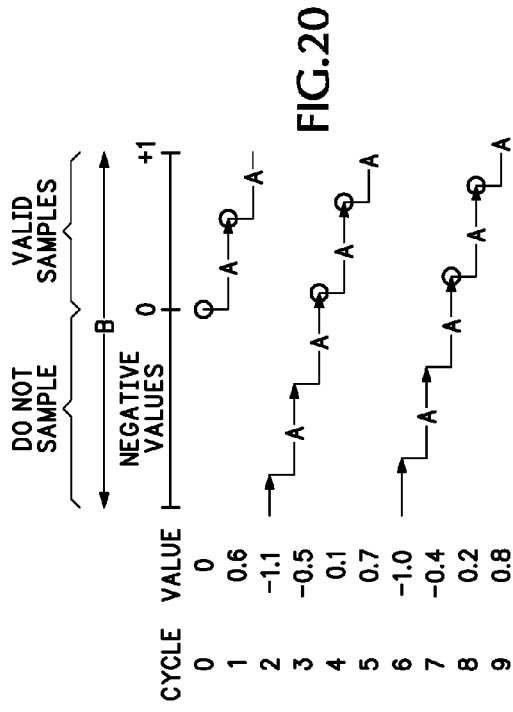
FIG. 20 is a timing diagram view illustrating the operation of the sampling channel of FIG. 15 according to the sample rate of FIG. 19 according to an embodiment of the present invention.
FIG. 21 is a fourth Table view illustrating predicted threshold crossing times according to an embodiment of the present invention.

The Table of FIG. 18 shows values for A, B and C for different sample rates given a system clock period of 4 ns and four sampling channels 205. The Table of FIG. 19 shows the digital clock values and sample times for an example where the desired sample rate period is 2.3 ns. The timeline of FIG. 20 shows the operation of the digital clock for the first sampling circuit 205₁ when programmed according to the Table of FIG. 19. The small circles indicate that a sample is to be taken.

Returning now to the clock channels 207 which recover the clock from the high speed serial data, the objective is to determine whether the clock phase is too early or too late. The clock phase adjust circuit 211 uses this information to adjust the clock phase. The clock channels receive groups of data as described above with respect to the sampling channels. The clock channels 207 are programmed to find the threshold crossings of the serial data when the crossings occur within the pipes connected to the clock channel. With four clock channels, the first clock circuit 207₁ finds the time of a threshold crossing when that crossing occurs within the first quarter of the pipes; the second clock circuit 207₂ finds every threshold crossing when the threshold crossing occurs within the second quarter of the pipes; etc.

Again, each clock channel 207 has a digital clock that is programmed to predict the threshold crossing of the high speed serial data. This time is usually between the samples. To compute the predicted threshold crossing time, the digital clock circuits work exactly the same way as the digital clock circuits of the sampling channels 205, except that the initial values are different. The same values for A, B and C are used, but the initial value of the digital clock for the first clock circuit 207₁ is set to N*S/(2*P). If this value is one or greater, then subtract B. The remaining initial values are calculated from the first value using the same procedure described above. The Table of FIG. 21 shows digital clock values for the clock channels 207 when the sample period is 1.1 ns, the system clock period is 4 ns and four clock channels are used. Each time the serial data passes through the threshold, one of the clock channels 207 detects it and measures the time of the threshold crossing. The time is measured so that a crossing at the earliest possible time is zero and at the latest possible time is nearly one. It takes a number of clock cycles to find the actual threshold crossing times. The digital clock value is passed down the pipeline so that, when the actual threshold crossing time is found, the corresponding digital clock value is available. If the digital clock phase is correct and if the serial data clock has no jitter, the measured time equals the digital clock value. The difference between the measured threshold crossing and the digital clock value is an indication of clock phase error. When computing this difference, modulo arithmetic is used. The sampling process is periodic. In the number system used for measuring time, the value B is equal to one period.

The clock phase error is computed as follows. First subtract the measured clock crossing from the expected clock crossing. The range of this result may be as large as B and as small as −1. When the result is negative, add B. Now the range may be as large as B and as small as zero. This result is compared to B/2. If it is larger than B/2, the digital clock phase should be reduced, and the clock channel produces an output indicating this. If it is smaller than B/2, the digital clock phase should be increased and the clock channel produces an output indicating this. If the clock channel does not find a threshold crossing, then the clock channel does not produce an output indicating that the clock phase should be adjusted.

The clock phase adjust circuit 211 receives inputs from all of the clock channels 207 on each system clock cycle. Each clock channel produces one of the following inputs: "increase clock phase", "decrease clock phase" or "no change to clock phase." The clock phase adjust circuit 211 sums the number of increases and decreases and produces one of the following results: (1) there are more requests to increase the clock phase; (2) there are more requests to decrease the clock phase; and (3) there are equal requests to increase and decrease the clock phase. The result is then passed back to all of the sampling and clock channels 205, 207 which then select one of three values for A to use in the next system clock cycle, as described below.

Because of round-off errors, or other small errors in the way the digital clock works, it is possible for the digital clock scheme to fail when the sample time happens to be very near the start or end of the time span of one sampling circuit 205. One failure results in the sample being taken twice—once at the end of one time span and also at the start of the next time span—and the other failure results in a sample being missed. In the Table of FIG. 17 the digital clock value for the fourth sampling circuit 205$_4$ is 0 in cycle 2. If this value is computed as −0.0000001 instead of 0, the sampling circuit does not sample the data and the one sample point is missed. On the other hand, the third sampling circuit 205$_3$ has a digital clock value of −0.1 in cycle 2. This value results because the value of A was added to the digital clock value, producing 1.0, and then B was subtracted. If, when A was added, the clock value was 0.999999 instead of 1.0, then B is not subtracted and the sample is taken twice. That is, a sample will be taken by the third sampling circuit at the end of the time span, and taken once again by the fourth sampling circuit at the start of the next time span. These errors are probably inevitable when the values of A and B are rounded.

The values of A and B may be modified so that missed samples never occur, but this increases the number of times that samples are taken twice. However, the data combiner 209 detects the duplicate samples and discards one of them. Each sampling channel 205 passes signals that indicate that a sample was taken very near the start or end of the time span. When the data combiner 209 detects that one sample is taken near the end of the time span of one of the sampling channels and near the start of the time span for the next sampling channel, the data combiner discards the second sample. The sampling channels 205 look at the digital clock value to detect when a sample is being taken near the start or end of the time span.

The digital clock phase is periodically adjusted by altering the value A that is used by all the channels 205, 207. There are three values for A: the nominal value that results in the desired sample rate; a smaller value that results in the clock phase being reduced; and a larger value that results in the clock phase being increased. For all three values of A, it is desired that no sample is skipped. The algorithm described above uses a constant of 1, which makes it easier to describe. But now values other than 1 are considered, and to do this a new term L is added as follows:

$A=L*N*(Int(P/S+1)*S/P-1)$ $B=L*N*S/P$ $C=L*N*S/P-1$

The digital clock value is now compared to a value M. The value of M is selected to match the programming range of the circuitry that interpolates between the pipes being processed by one of the sampling circuits 205. If all of the values A, B, C, L and M are increased or decreased by the same amount, the sample rate remains the same.

In the prior discussion L==M, where the symbol "==" in computer programming notation indicates a comparison of the data values such that the expression is true when the value of L equals the value of M. The symbol "==" is used to distinguish from the computer programming notation "=" which indicates that the value of the variable on the left assumes the value of the expression on the right.

When the value of M is slightly larger than L, then the circuit samples more often. Whenever the digital clock value becomes greater than L, but less than M, the digital clock value is allowed to remain positive, and a sample is taken that is not taken when M and L are equal. When one of these extra samples is taken, which happens at the end of the time span of one sampling circuit 205, the next sampling circuit continues to sample at the beginning of its time span. The second of these samples that are taken at almost the same time is discarded by the data combiner 209. The advantage of making M slightly larger than L is that it is possible to insure that small errors in computing A, B and C only result in duplicate samples, never in missed samples. The circuitry may be designed to eliminate the duplicate samples, but cannot recover a missed sample.

The three values of A are: An for the nominal value, Aa for the larger value that advances the phase, and Ar for the smaller value that retards the phase. The effect of the three values of A, is described below. For a previously computed value of B and any sample rate S, A becomes:

$A=B*((Int(P/S+1)*S-P)/S$

This equation allows for values Aa and Ar to be computed from the maximum and minimum desired sample rates.

When multiple sampling channels 205 are used, the initial phase of the digital clock is set using the values for B and C that are computed from the nominal sampling rate. The timing between sampling circuits works well only when A takes on the nominal value An. Making A larger or smaller in order to adjust the digital clock phase introduces timing errors between the sampling circuits. As long as all digital clock circuits are changed by the same amount on each cycle, the timing errors do not accumulate.

When A is increased to Aa, the additional amount added to the digital clock value may result in the value becoming larger than M when it would not have otherwise become larger. In this case B is subtracted from the digital clock value causing the value to become negative and a sample is missed. Adjusting the clock phase should not result in missing samples. Therefore, the difference between M and L is at least as large as Aa-A.

When A is decreased to Ar, the smaller amount added to the digital clock value may result in the digital clock amount being negative instead of advancing past zero to become positive. This results in one sampling circuit 205 not taking a sample. Therefore M is larger than L by an amount at least as large as A-Ar so that the previous sampling circuit acquires the sample.

The following example indicates how the values An, Aa and Ar are calculated. The nominal sample period is S=1.1 ns, the system clock period is P=4 ns and the number of sampling circuits 205 is N=4. The fastest sampling period is 1.09 ns and the slowest sampling period is 1.11 ns. Initially M=L=1 and the nominal values of A, B and C are calculated as A=0.4, B=1.1 and C=0.1. Using B=1.1 Ar and Aa are calculated from the above equation using the respective maximum and minimum sampling periods. Ar is about 0.3633 and Aa is about 0.4360, making a difference from An of about 0.037. Therefore M=1.037 so that samples are not missed. But since M is preferably 1 so the digital clock does not become 1 or greater, all of the values A, B, C, L and M are divided by 1.037 to produce the following values:

Ar=0.3503

An=0.3857

Aa=0.4204

B=1.0608

C=0.0964

L=0.9643

M=1

The Tables of FIGS. 22-24 shows the sample time values using the above values. In the Table of FIG. 22 a sample period of 1.1 ns is used; in the Table of FIG. 23 a sample period of 1.09 ns is used; and in the Table of FIG. 24 a sample period of 1.11 ns is used. The small timing errors arise because L does not match M. Referring to FIG. 22 in cycle 2 two sampling circuits sample the same point—the third sampling circuit sampling near the end of its time span and the fourth sampling circuit sampling at the start of its time span. The sample from the fourth sampling circuit is discarded.

Not shown in the Tables of FIGS. 22-24 is how the sample rate may change cycle-by-cycle. The timing errors, up to 60 ps in these Tables, are small relative to the sample rate. The timing errors are smaller when the amount of phase adjustment is smaller.

Although three values for A are discussed above, other schemes also work. In one scheme there are just two values of A: Aa and Ar.

The phase adjustment circuit 211 exhibits a delay of many system clock cycles between detecting a phase error and making an adjustment. This delay is inherent in the pipelined nature of the process of finding the threshold crossings. The frequency of the serial data clock has to be accurate and stable for the above-described clock phase adjustment algorithm to work. The phase adjustment circuit 211 has a large gain for very small phase errors. No matter how small the phase error is, all threshold crossings are judged to be either early or late. This high gain, along with the long delay, ensures that some sort of oscillation takes place in the phase adjustment circuit 211. The phase error introduced by this oscillation is about as large as the phase adjustment made by Ar or Aa multiplied by the number of system clock cycles in the phase feedback loop. If this error is small relative to the expected clock jitter, it may be ignored.

There are two ways of reducing the clock phase error, either the gain or the feedback delay may be reduced. The gain may be reduced by looking at the magnitude of the detected phase errors and using multiple values of Ar and Aa. The delay may be reduced by eliminating the pipeline for the digital clock values in the clock channels 207 so that clock phase changes take place immediately without a pipeline delay. This change makes it a bit more difficult to compute the initial digital clock values for the clock channels.

Although the above describes the processing of high speed serial data, the same circuitry may be used for low speed serial data. With low speed data only one sampling channel 205 and one clock channel 207 are used.

Thus, the present invention provides a logic analyzer that uses a digital filter to restore data signal fidelity and improve timing, a memory for storing the logic level data of the digital signal, a separate memory for storing the acquired data for display of an analog representation of the data, and an architecture suitable for processing both high and low speed serial data.

What is claimed is:

1. A logic analyzer, comprising:
   a clock channel, wherein said clock channel receives a signal under test from a probe connected to a circuit under test, and provides a clock signal at an output;
   a plurality of associated data channels, wherein each data channel receives said signal under test from said probe connected to said circuit under test, and provides a logic signal at an output;
   said clock channel including a clock channel digitizer that receives said signal under test and digitizes said signal under test to produce a series of multi-bit clock samples; and
   each of said data channels including a data channel digitizer that receives said signal under test and digitizes said signal under test to produce a series of multi-bit data samples;
   a clock channel interpolator receiving said multi-bit clock samples and resampling said multi-bit clock samples prior to storage in a deep memory; and
   each of said data channels including a data channel interpolator receiving said multi-bit data samples and re-sampling said multi-bit data samples in accordance with said re-sampled multi-bit clock samples to determine logic level of said signal under test at precise times prior to storage of a signal indicative of said logic levels in said deep memory.

2. The logic analyzer as recited in claim 1, further comprising:
   a digital filter receiving said series of multi-bit data samples from said digitizers and digitally filtering said multi-bit data samples to produce enhanced multi-bit samples as said multi-bit samples applied to said interpolators.

3. The logic analyzer recited in claim 2, further comprising: a local waveform memory that receives and stores said enhanced multi-bit samples as an analog representation of said signal under test for subsequent display on a display device.

4. The logic analyzer recited in claim 3, wherein said clock channel interpolator comprises detection circuitry that detects edges in the signal under test when processing said enhanced multi-bit samples to produce a sample clock for controlling each of said data interpolators of each of said data channels to resample said multi-bit data samples.

5. The logic analyzer recited in claim 2 wherein said digital filter comprises a plurality of filters coupled in series to process said multi-bit samples to produce said enhanced multi-bit samples.

6. The logic analyzer recited in claim 5, wherein said plurality of filters comprises:
   an RC reduction filter;
   a noise reduction filter; and
   a reflection suppression filter; wherein
   all of said filters are coupled in series such that a first one of the filters receives said multi-bit samples at an input and a last one of said filters provides the enhanced multi-bit samples at an output.

7. The logic analyzer recited in claim 6, wherein said noise reduction filter comprises a moving average filter coupled in series with said RC reduction filter.

8. The logic analyzer recited in claim 1, wherein said signal under test comprises for high speed serial data, further comprising:
   a plurality of clock channels, each of said clock channels being coupled to receive said multi-bit clock samples;
   a plurality of corresponding data channels, each of said data channels being coupled to receive said multi-bit data samples;
   clock phase adjusting circuitry adjusting a clock phase determined from said plurality of clock channels to provide a re-sampling clock signal for the re-sampling said multibit data samples of said data channels; and
   said data interpolators combining outputs from said data channels developed in response to said re-sampling clock signal to produce a serial data output signal.

* * * * *